United States Patent
Inui et al.

(10) Patent No.: US 6,496,964 B2
(45) Date of Patent: Dec. 17, 2002

(54) METHOD FOR DESIGNING SEMICONDUCTOR DEVICE

(75) Inventors: Masuo Inui, Kasugai (JP); Takashi Yoneda, Kasugai (JP); Rieko Toki, Kasugai (JP); Hiroyuki Yamamoto, Kawasaki (JP); Kenji Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 103 days.

(21) Appl. No.: 09/815,053

(22) Filed: Mar. 23, 2001

(65) Prior Publication Data

US 2002/0002700 A1 Jan. 3, 2002

(30) Foreign Application Priority Data

Jun. 30, 2000 (JP) .......................................... 2000-198175

(51) Int. Cl.$^7$ ................................................. G06F 9/45
(52) U.S. Cl. ................................. 716/8; 716/11; 716/12
(58) Field of Search ............................ 716/8, 9, 10, 11, 716/12, 13, 14, 7

(56) References Cited

U.S. PATENT DOCUMENTS

| | | | | |
|---|---|---|---|---|
| 4,811,237 A | * | 3/1989 | Putatunda et al. ........... 364/491 |
| 5,972,740 A | * | 10/1999 | Nakamori ..................... 438/129 |
| 6,086,628 A | * | 7/2000 | Dave et al. ..................... 716/7 |
| 6,170,079 B1 | * | 1/2001 | Kato et al. ..................... 716/10 |
| 6,434,730 B1 | * | 8/2002 | Ito et al. .......................... 716/8 |

* cited by examiner

Primary Examiner—Tuan T. Lam
Assistant Examiner—Hiep Nguyen
(74) Attorney, Agent, or Firm—Staas & Halsey LLP

(57) ABSTRACT

A method for designing a semiconductor device having a plurality of logic elements provided with a plurality of power supplies. First, a power supply type name is given to each power supply in accordance with the purpose of the power supply in each logic element. Each logic element is associated with the power supply type name of the power supply that is to be provided to the logic element. A power supply group is formed for each power supply. Specific information of each power supply group associating the power supply type name with supplied voltage is generated. Then, the power supply provided to each logic element is determined by allocating the power supply group to the logic element. The method simplifies designing the layout of a semiconductor device operated by multiple power supplies.

16 Claims, 8 Drawing Sheets

Fig.3

| Power Supply Name | Power Supply Usage |
|---|---|
| VDDEXT | Power Supply for anInterface Connected with External Device |
| VDDINT | Power Supply for Internal Logic |
| VSS | Ground |

Fig.4

| Cell Type | High Potential Power Supply | Low Potential Power Supply |
|---|---|---|
| Internal Unit Cell | VDDINT | VSS |
| I/O Cell | VDDINT VDDEXT | VSS |

Fig.5

| Power Supply Group Name | Power Supply Voltage | Power Supply |
|---|---|---|
| VDDE1 | 5.0 [V] | VDDEXT |
| VDDI1 | 3.3 [V] | VDDINT |
| VDDI2 | 2.5 [V] | VDDINT |
| VSS | 0 [V] | VSS |

| Logic Element | Power Supply | Parameter |
|---|---|---|
| UC1 | VDDINT | Q1 |
|  | VSS | Q1 |
| IO1 | VDDINT | Q2 |
|  | VDDEXT | Q3 |
|  | VSS | Q4 |

Fig.12

| Logic Element | Signal Fluctuation Number |
|---|---|
| module1.UC1 | F1 |
| module1.IO1 | F2 |
| module2.UC1 | F3 |
| module2.IO1 | F4 |

Fig.13

| Logic Element | Power Supply | Power Supply Group | Voltage (V) | Power Consumption (W) |
|---|---|---|---|---|
| module1.UC1 | VDDINT | VDDI2 | 2.5 | 1.25·Q1·F1 |
|  | VSS | VSS | 0 | ------- |
| module1.IO1 | VDDINT | VDDI2 | 2.5 | 1.25·Q2·F2 |
|  | VDDEXT | VDDE1 | 5.0 | 2.5·Q3·F3 |
|  | VSS | VSS | 0 | ------- |
| module2.UC1 | VDDINT | VDDI1 | 3.3 | 1.65·Q1·F3 |
|  | VSS | VSS | 0 | ------- |
| module2.IO1 | VDDINT | VDDI1 | 3.3 | 1.65·Q2·F4 |
|  | VDDEXT | VDDE1 | 5.0 | 2.5·Q3·F4 |

| Power Supply Group | Voltage (V) | Power Consumption (W) |
|---|---|---|
| VDDI1 | 3.3 | 1.65·(Q1·F3+Q2·F4) |
| VDDI2 | 2.5 | 1.25·(Q1·F1+Q2·F2) |
| VDDE1 | 5.0 | 2.5·Q3·(F3+F4) |

METHOD FOR DESIGNING SEMICONDUCTOR DEVICE

BACKGROUND OF THE INVENTION

The present invention relates to a method for designing a semiconductor device, and more particularly, to a method for designing a semiconductor device operated at different power supply voltages.

In the prior art, two methods have been proposed to design the layout of a semiconductor device having multiple power supply systems. These two methods are described below.

In the first method, information of a power supply line (net list) is generated. Power line patterns are connected to circuit patterns based on the line information to separate power supplies.

In the second method, a library of logic elements is prepared for each type of power supply. Power supply connections are determined based on each library to design a layout that separates power supplies.

However, in the first method, the designer must accurately recognize the power supply terminal of each logic element and know what type of power supply is connected to each logic element to generate the net list of the power supply line. This makes it burdensome to the designer.

Further, in the second embodiment, the number of libraries that have to be prepared increases as the types of power supplies increases. This limits the application of the libraries.

In addition, the information for separating the power supplies is generated only when the logic elements are determined in the first and second methods.

Methods of logic simulation (e.g., delay calculation) and power consumption calculation have also been proposed. These methods (i.e., a third method and a fourth method) are described below.

In the third method, a multiple power supply semiconductor device is assumed to be a single power supply semiconductor device to perform delay calculation and power consumption calculation.

In the fourth method, a functional macro is set for each power supply, and the delay calculation and power consumption calculation is performed for each functional macro.

However, errors in the results of the delay calculation and power consumption calculation are relatively large in the third method. Thus, operational confirmations may not be performed accurately and the estimate of power consumption may not be accurate. As a result, re-designing may become necessary.

The semiconductor device is divided into multiple functional macros in the fourth method. This makes it difficult to inspect the semiconductor device as a whole. Further, the usage of macros decreases the designing efficiency.

SUMMARY OF THE INVENTION

It is an object of the present invention to provide a method that facilitates the designing of a layout of a semiconductor device operated by multiple power supplies.

To achieve the above object, the present invention provides a method for de signing a semiconductor device having a plurality of logic elements provided with a plurality of power supplies. The method includes giving a power supply type name to each power supply in accordance with the purpose of the power supply in each logic element, associating each logic element with the power supply type name of the power supply that is to be provided to the logic element, forming a power supply group for each power supply, generating specific information of each power supply group associating the power supply type name with supplied voltage, and determining the power supply provided to each logic element by allocating the power supply group, which is associated with the supplied voltage and the power supply type name of the power supply provided to the logic element, to the logic element.

The present invention also provides a computer readable recording medium recording a program for designing a semiconductor device having a plurality of logic elements provided with a plurality of power supplies. The program includes the steps of giving a power supply type name to each power supply in accordance with the purpose of the power supply in each logic element, associating each logic element with the power supply type name of the power supply that is to be provided to the logic element, forming a power supply group for each power supply, generating specific information of each power supply group associating the power supply type name with supplied voltage, and determining the power supply provided to each logic element by allocating the power supply group, which is associated with the supplied voltage and the power supply type name of the power supply provided to the logic element, to the logic element.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a table used to describe a power supply naming step in the flowchart of FIG. 2;

FIG. 4 is a table used to describe a power supply assigning step in the flowchart of FIG. 2;

FIG. 5 is a table used to describe a power supply group formation step in the flowchart of FIG. 2;

FIG. 12 is a table used to describe the multiple power supply power consumption calculation step in the flowchart of FIG. 2;

FIG. 13 is a table used to describe the multiple power supply power consumption calculation step in the flowchart of FIG. 2;

DETAILED DESCRIPTION OF THE PREFERRED EMBODIMENTS

Figure 1:
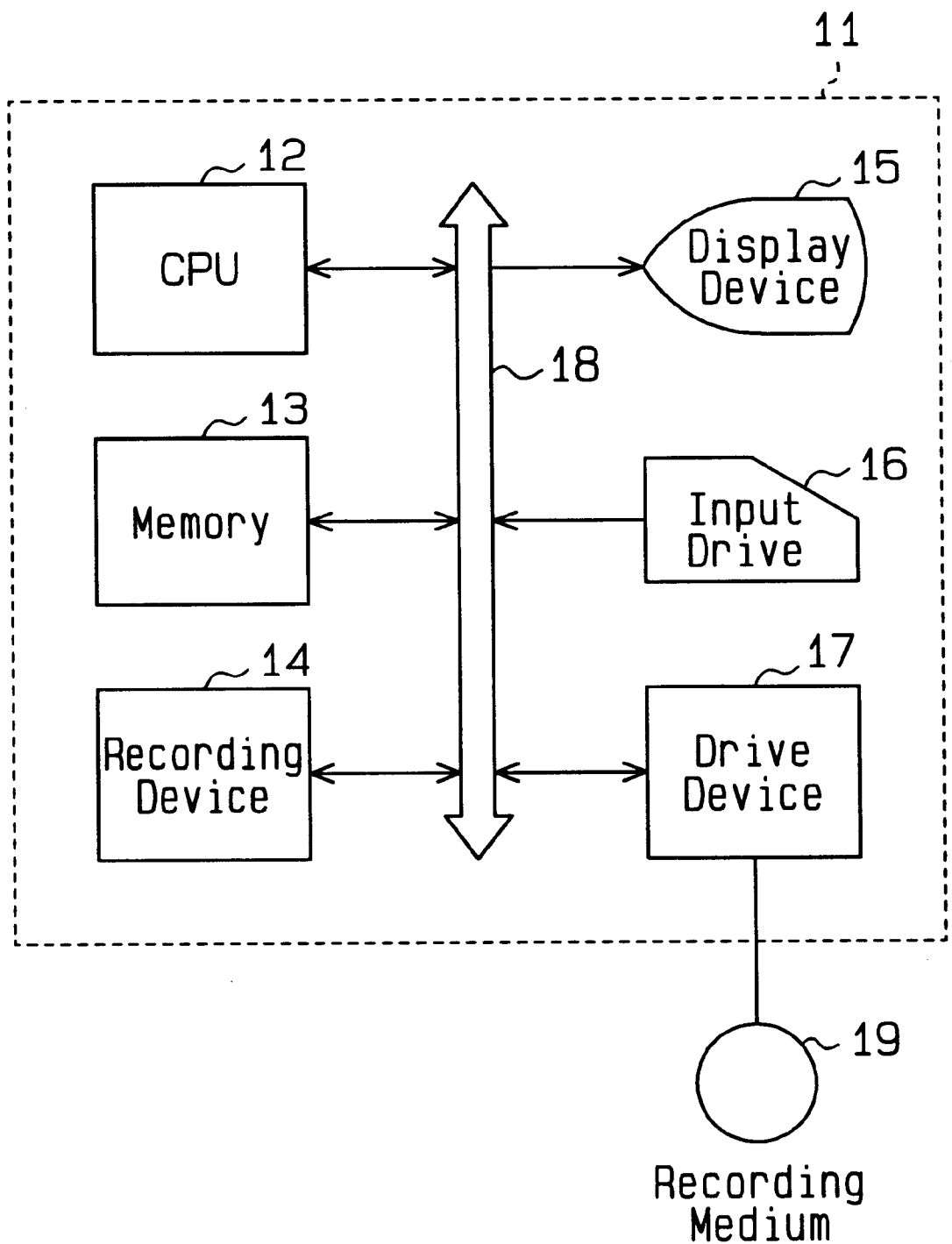
FIG. 1 is a schematic block diagram of a computer system employed in the present invention.

In the drawings, like numerals are used for like elements throughout. With reference to FIG. 1, a computer system 11 employed in the present invention is preferably a computer aided design (CAD) apparatus used to design the layout of a multiply power supply semiconductor device. The computer system 11 includes a central processing unit (CPU) 12, a memory 13, a recording device 14, a display 15, an input device 16, and a drive device 17.

The CPU 12 executes the program stored in the memory 13 to design the layout of a multiple power supply semiconductor device and perform delay calculation and power consumption calculation. The memory 13 stores programs and data required to perform various processing. The memory 13 preferably includes a cache memory, a system memory, and a display memory.

The display 15 is preferably a Braun tube (CRT), a liquid crystal display (LCD), or a plasma display panel (PDP) and displays screens, such as a layout screen and a parameter input screen. The input device 16 includes a keyboard and a mouse (nether shown) used by a user to input parameters, requests, and instructions.

Figure 2:
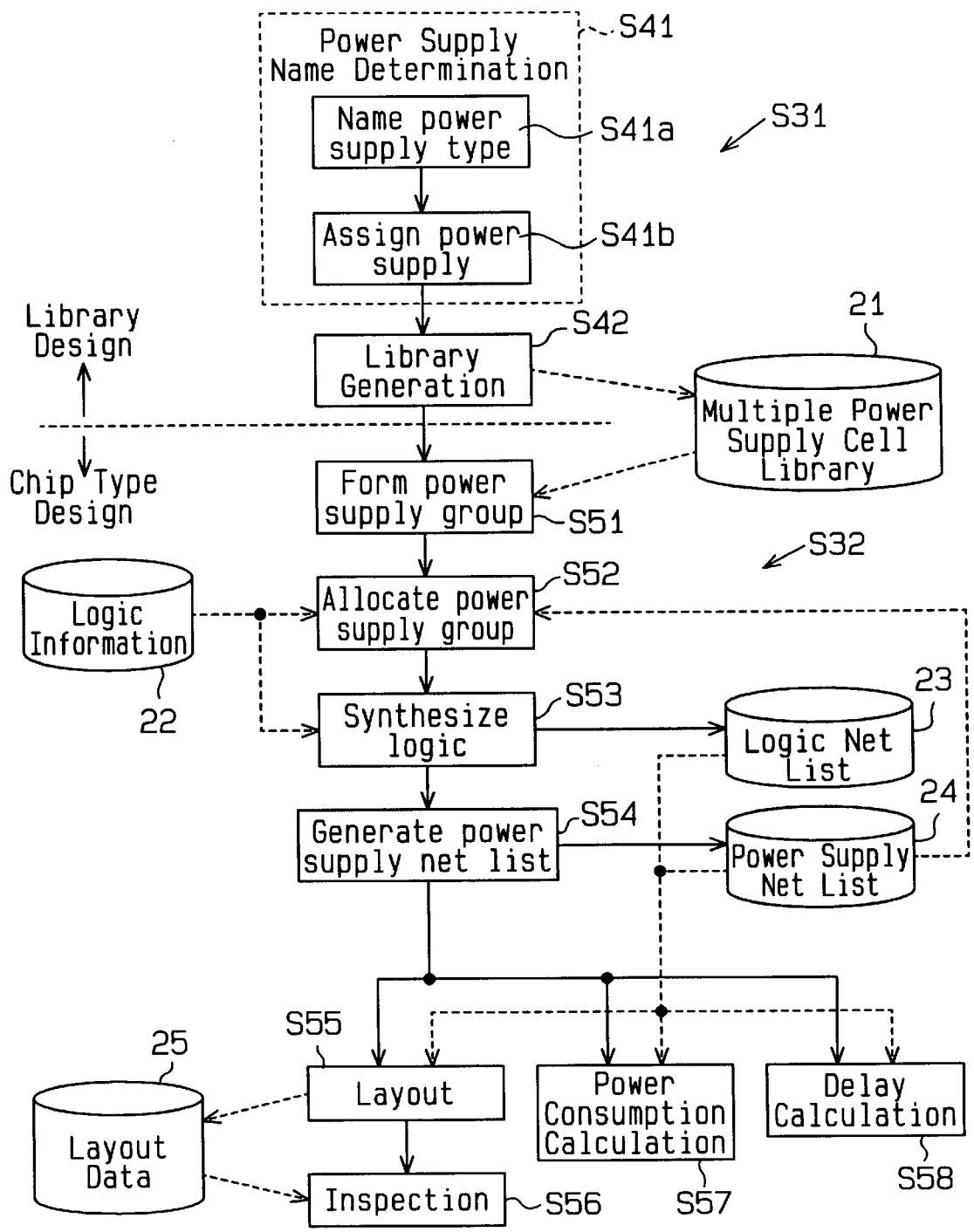
FIG. 2 is a flowchart illustrating a method for designing a multiple power supply device according to the present invention.

The recording device 14 is preferably a magnetic disc device, an optical disc device, or a magneto-optical device. The recording device 14 stores a program for designing the layout of a multiple power supply semiconductor device and first to fifth files 21–25 (FIG. 2). In response to an input instruction from the input device 16, the CPU 12 transfers the program and data from the recording device 14 to the memory 13 and executes the program.

The program and data executed by the CPU 12 is recorded on the recording medium 19. The drive device 17 drives the recording medium 19 and accesses the recording data. The CPU 12 receives the program and data read from the recording medium 19 by the drive device 17 and installs the program and data in the recording device 14.

A computer readable recording medium, such as a magnetic tape (MT), a memory card, a floppy disk, an optical disc (e.g., CD-ROM, DVD-ROM), and a magneto-optical disc (e.g., MO, MD), may be used as the recording medium 19. Alternatively, the program and data may be stored on the recording medium 19 and loaded to the memory 13 when necessary.

The recording medium 19 includes a medium or disc device that records program data uploaded or downloaded by means of a communication medium. The recording medium 19 also includes a recording medium that records a program directly executed by a computer, a recording medium that records a program executed when installed in another recording medium (e.g., hard disk), or a recording medium that records an encoded or compressed program.

A layout designing process of the multiple power supply semiconductor device (multiple power supply designing process) will now be discussed with reference to FIG. 2.

The layout designing process includes a library designing step, or first step S31, and a chip type designing step, or second step S32.

In the first step S31, the CPU 12 stores a multiple power supply cell library, which defines a plurality of logic elements (cells) operated by a plurality of power supplies, in the first file 21. The library defines each power supply system required to operate each cell. In other words, the library defines a plurality of power supply systems so that each power supply system can be distinguished from the others.

In the second step S32, the CPU 12 uses the multiple power supply library stored in the first file 21 and logic information of the semiconductor device stored in the second file 22 to generate a logic net list and a power supply net list of the semiconductor device. The CPU 12 stores the logic net list and the power supply net list in the third and fourth files 23, 24, respectively. The CPU 12 generates layout data of the semiconductor device based on the logic net list and the power supply net list and stores the layout data in the fifth file 25. Further, the CPU 12 calculates the power consumption of the semiconductor device and calculates the delay of logic signals based on the logic net list and the power supply net list.

The first step S31 will now be described in detail.

The first step S31 includes a power supply name determination step S41 and a library generation step S42. Step S41 includes a power supply type naming sub-step, or a first sub-step S41a, and a power supply assignment sub-step, or a second sub-step S41b.

In the first sub-step S41a, the CPU 12 names power supply types in accordance with the purpose of the power supply. For example, referring to FIG. 3, the CPU 12 names a power supply used for an interface connected with an external device as VDDEXT, a power supply used for an internal logic as VDDINT, and a power supply corresponding to the ground as VSS.

In the second sub-step S41b, the CPU 12 associates each logic element (cell) with the name of the necessary power supply. For example, an internal unit cell includes an internal logic element that requires the ground and one power supply. Thus, referring to FIG. 4, the CPU 12 associates the high potential power supply VVDINT and the low potential power supply VSS with the internal unit cell.

An I/O cell converts the voltage of a signal provided from an external device to a voltage that is optimal for an internal logic element. The I/O cell requires the ground and two power supply voltages. The two power supply voltages must be separated from each other. Thus, referring to FIG. 4, the CPU 12 associates the high power supplies VDDINT, VDDEXT and the low potential power supply VSS with the I/O cell. In other words, when multiple power supply voltages are required and the power supply voltages must be separated, each power supply voltage receives a different power supply name. If the same power supply name were used for difference power supply voltages, the logic element would be considered short-circuited.

In step S42, the CPU 12 generates a cell library associating a cell with a power supply name. The CPU 12 then stores the cell library in the first file 21.

Figure 6:
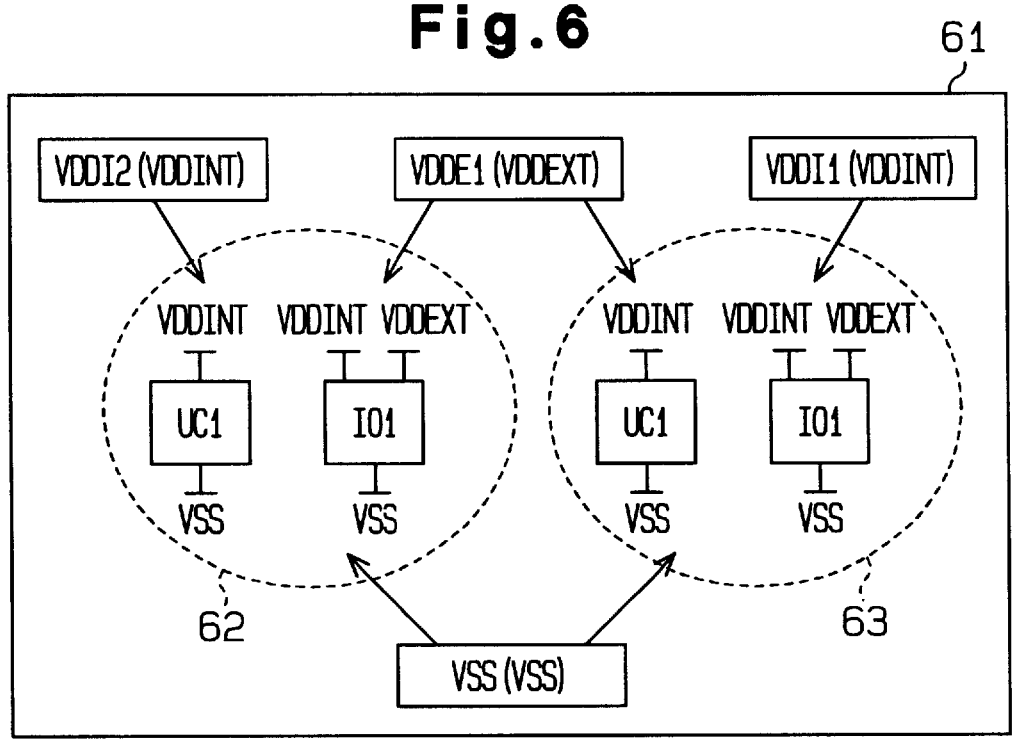
FIG. 6 is a schematic block diagram illustrating a power supply group allocation step in the flowchart of FIG. 2.

For example, referring to FIG. 6, an internal unit cell UC1 and an I/O cell IO1 are registered in the cell library. The internal unit cell UC1 has a high potential power supply represented by VDDINT and a low power supply (ground) represented by VSS. The I/O cell IO1 has two types of high potential power supplies represented by VDDINT and VDDEXT and a low potential power supply represented by VSS.

The second step S32 for designing chips in accordance with its type will now be described in detail with reference to FIG. 2.

The second step S32 includes sub-steps S51 to S58. The first sub-step S51 forms power supply groups. In the first sub-step S51, the CPU 12 defines each independent power supply (physically insulated power supply) provided to the semiconductor device as a single power supply group and names the power supply group. The CPU 12 further associates the name of each power supply group with a power supply voltage and a power supply name.

For example, the semiconductor device is provided with a power supply of 5V for an external device interface and power supplies of 3.3V, 2.5V, and ground 1V for the internal logics. As shown in FIG. 5, the CPU 12 respectively assigns the group names VDDE1, VDDI1, VDDI2, and VSS to the independent power supplies. Then, the CPU 12 associates the voltage of 5.0V and power supply VDDEXT to power supply group VDDE1 and the voltage of 3.3V and power supply VDDINT to power supply group VDDI1. Further, the CPU 12 associates the voltage of 2.5V and power supply VDDINT to power supply group VDDI2 and the voltage of 0V and power supply VSS to the power supply group VSS.

The second sub-step S52 allocates the power supply. In the second sub-step S52, the CPU 12 sets the power supply provided at each hierarchical logic level of the modules in the semiconductor device. The CPU 12 then allocates to each logic element the power supply group associated with the power supply of each logic element.

With reference to FIG. 6, the semiconductor device 61 includes two modules 62, 63. Each of the modules 62, 63 includes the unit cell UC1 and the I/O cell IO1. In this manner, the semiconductor device 61 has a hierarchical structure, and the logic information of each module and cell also has hierarchical structure.

The first module 62 is operated by an external power supply of 5.0V and an internal power supply of 2.5V. The CPU 12 sets the power supply provided to the hierarchical level of the first module 62 at 2.5V and allocates power group VDDI2 to the power supply terminals for the internal logic power supplies VDDINT of the cells UC1, IO1. The allocation of the power supply group VDDI2 may also be performed at the hierarchical level of the cells UC1, IO1.

The second module 63 is operated by an external power supply of 5.0V and an internal power supply of 3.3V. The CPU 12 sets the power supply provided to the hierarchical level of the second module 63 at 3.3V and allocates power group VDDI1 to the power supply terminals for the internal logic power supplies VDDINT of the cells UC1, IO1. The allocation of the power supply group VDDI1 may also be performed at the hierarchical level of the cells UC1, IO1.

Figure 7:
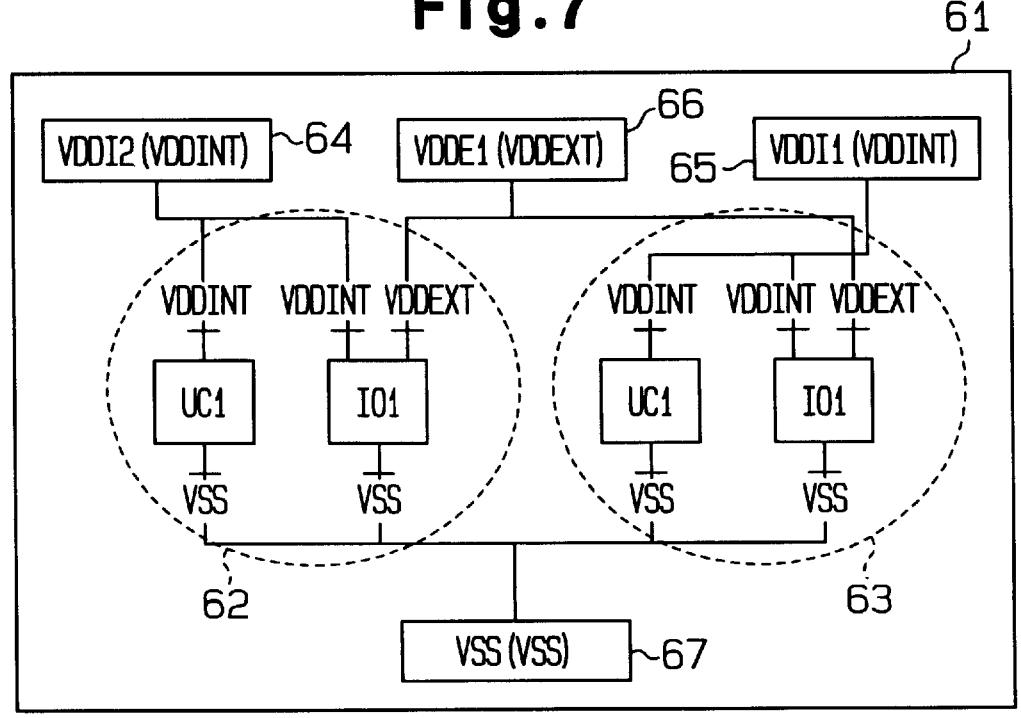
FIG. 7 is a schematic block diagram of the semiconductor device provided with multiple power supplies.

In this manner, referring to FIG. 7, the supplied power is set so that the two internal logic power supplies VDDINT is provided separately in each of the first and second modules 62, 63. In other words, the internal logic power supply VDDINT of 3.3V and the internal logic power supply VDDINT of 2.5V are separated at the hierarchical logic level of the module.

The third sub-step S53 synthesizes logics. In the third sub-step S53, the CPU uses the logic information of the semiconductor device to generate a logic circuit and a logic net list of the logic circuit. The CPU 12 then stores the logic net list in the third file 23.

The fourth sub-step S54 generates a power supply net list. In the fourth sub-step S54, the CPU 12 generates the power supply net list from the logic circuit generated in the third sub-step S53 and stores the power supply net list in the fourth file 24.

Figure 8:
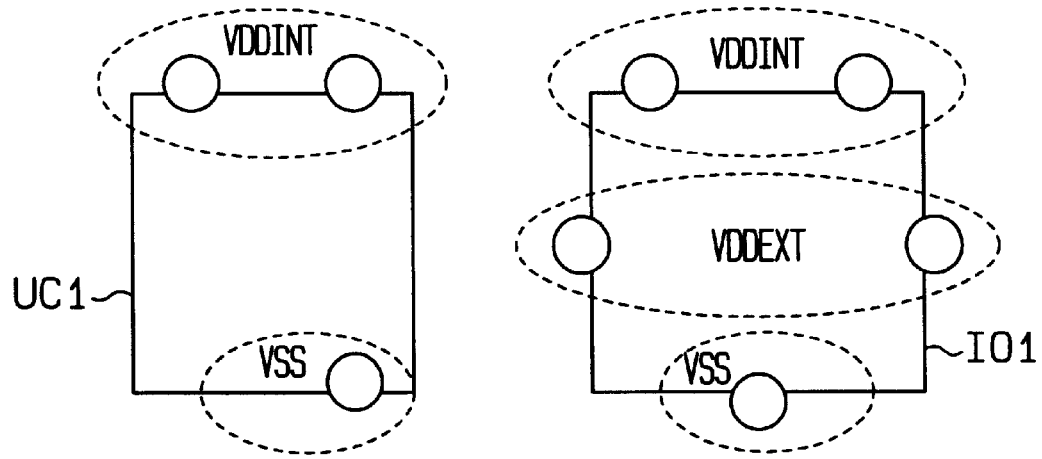
FIG. 8 is an explanatory diagram illustrating the relationship between the power supply name and power supply terminal.

The relationship between the power supply terminals of the unit cell UC1 and the I/O cell IO1 and the name of the power supply of each power supply terminal is predetermined as shown in FIG. 8. Further, the relationship between each external terminal of the semiconductor device and the name of the power supply of each external terminal is predetermined as shown in FIG. 9.

Figure 9:
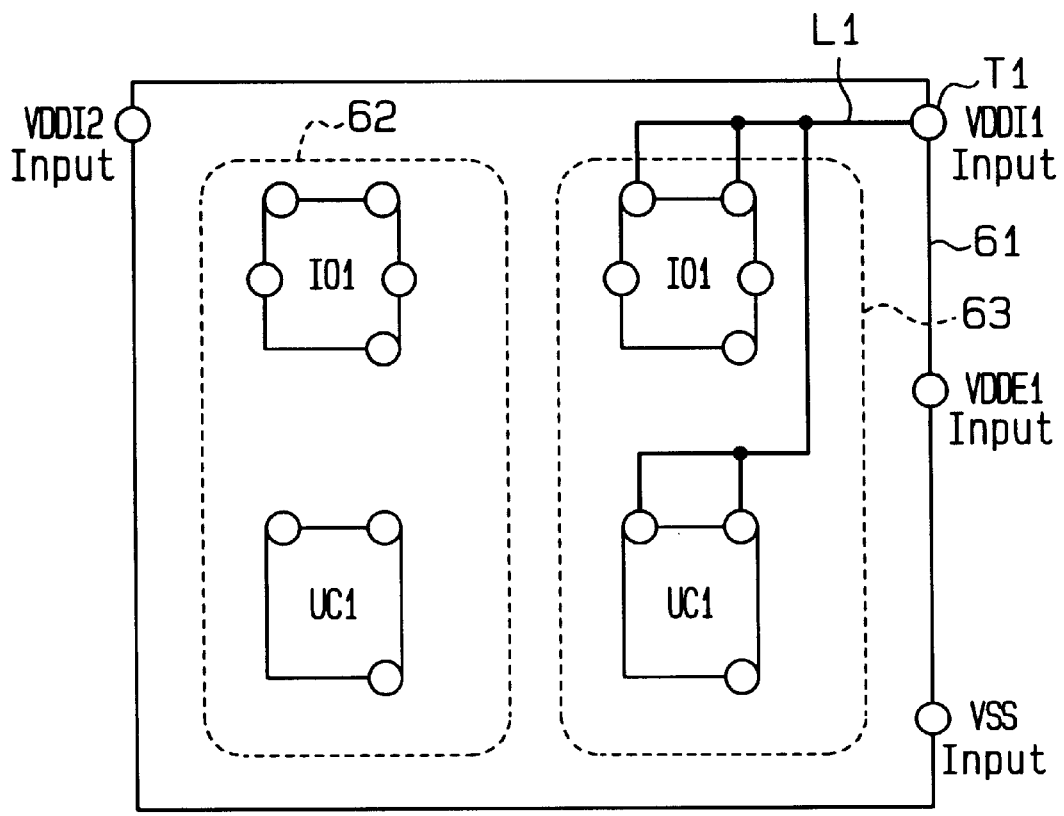
FIG. 9 is a schematic block diagram of a semiconductor device illustrating the line layout of power supplies.

With reference to FIG. 9, the CPU 12 generates the power supply net list so that an external terminal T1, which is provided with the internal power supply VDDI1, and the power supply terminals of the I/O cell IO1 and the unit cell UC1 are connected by a power supply line L1. The CPU 12 generates a power supply net list for other power supplies in the same manner. The CPU 12 stores the generated power supply net list in the fourth file 24.

The fifth sub-step S55 generates a layout. In the fifth sub-step S55, the CPU 12 generates a floor plan based on the logic and power supply net lists stored in the third and fourth files 23, 24 and lays out modules and cells.

In this state, the CPU 12 arranges two or more logic elements (cells) that receive power from the same power supply group physically close to one another. For example, the I/O cell IO1 and unit cell UC1 of the second module 63 receive power from the power supply group VDDI1. Thus, the CPU 12 arranges the cells IO1, UC1 physically close to each other. In this manner, by arranging the cells IO1, UC1 close to the power supply of the power supply group VDDI1 so that the power supply terminals of a logic element are located close to each other, the power supply line length is shortened and the influence on other lines are decreased.

Then, the CPU 12 generates layout data by laying out the logic wiring and the power supply wiring that connect the laid out cells and external terminals. The CPU 12 stores the layout data in the fifth file 25 of FIG. 2.

Figures 10, 11:
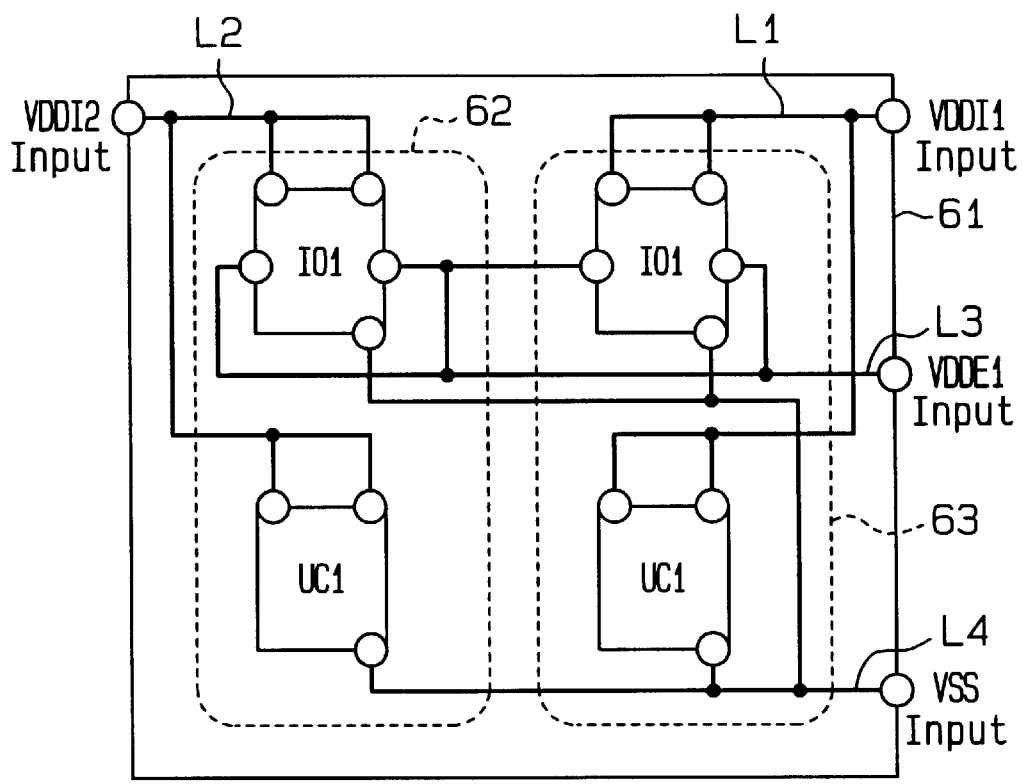
FIG. 10 is a schematic block diagram of a semiconductor device illustrating the line layout of every power supply.
FIG. 11 is a table used to describe a multiple power supply power consumption calculation step in the flowchart of FIG. 2.

Referring to FIG. 9, with regard to the power supply group VDDI1, the CPU 12 lays out power supply line L1 to the power supply terminals related with the power supply VDDINT of the I/O cell IO1 and the unit cell UC1 of the second module 63. Referring to FIG. 10, the CPU 12 then lays out power supply lines L2, L3, and L4 for the other power supply groups in the same manner.

The sixth sub-step S56 conducts an inspection. In the sixth sub-step S56, the CPU 12 inspects layout data. In other words, the CPU 12 compares the layout data of the semiconductor device that is generated in the fifth sub-step S55 with the logic net list and the power supply separation information (power supply net list) to inspect whether the lines are properly connected.

The seventh sub-step S57 calculates power consumption. In the seventh step S57, the CPU 12 applies a different potential to each logic element based on the power supply information of each logic element to calculate the power consumption. By adding the calculated power consumption value of each logic element, the power consumption of the entire semiconductor device is estimated.

The CPU 12 calculates the power consumption of a multiple power supply device in a manner described below.

(a) The CPU 12 pre-calculates power consumption of each logic element. FIG. 11 shows the power consumption parameter of the unit cell UC1 and the I/O cell IO1. The unit of the power consumption parameter is F.

(b) The CPU 12 calculates the number of signal fluctuations per unit time (e.g., one second). The signal fluctuation number is inherent to the logic element. Referring to FIG. 12, for example, the logic element name of module1.UC1 represents the unit cell UC1 of the first module 62, and the signal fluctuation number at a signal output terminal of the unit cell UC1 is F1.

(c) Based on the power consumption parameter, the signal fluctuation number, and the power supply voltage of each power supply group, the CPU 12 calculates the power consumption value of each power supply of the logic elements using a power consumption formula of $E=\frac{1}{2} \cdot CV^{\wedge}2F$ (^represents a power) of a CMOS signal fluctuation.

Figures 14, 15:
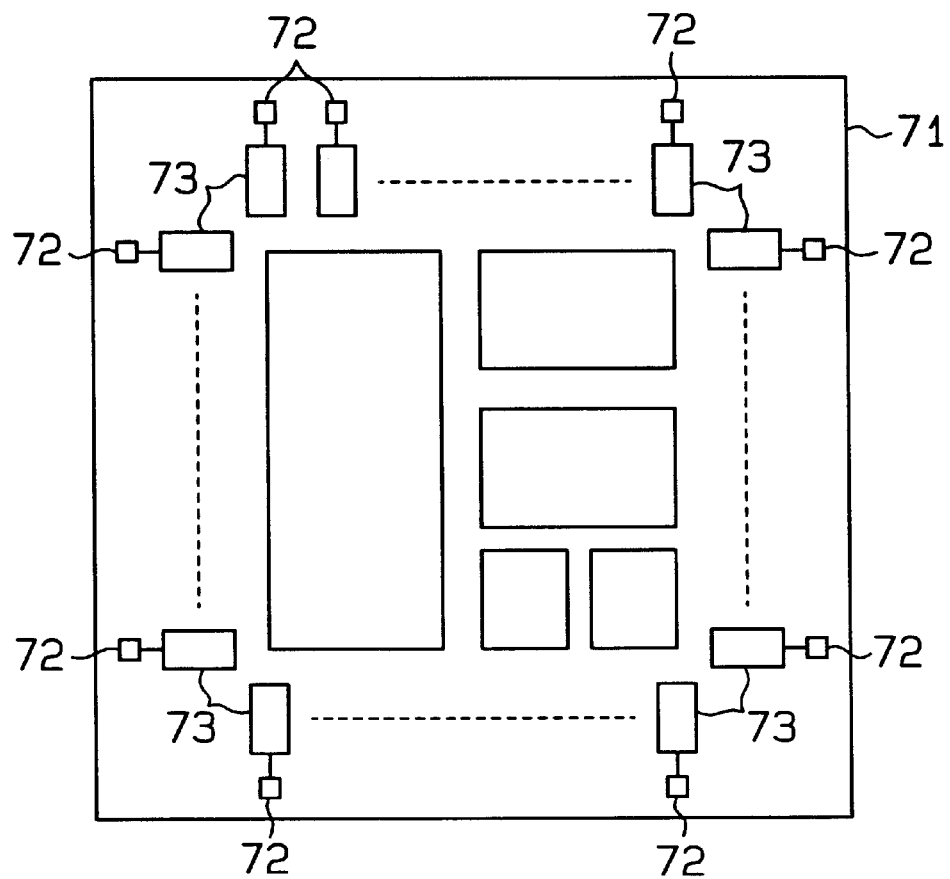
FIG. 14 is a table used to describe the multiple power supply power consumption calculation step in the flowchart of FIG. 2.
FIG. 15 is a schematic block diagram of the semiconductor device.

(d) The CPU 12 adds the power consumption value of each logic element provided by the power supply of each power supply group. The sums of the power consumption values are shown in FIG. 14.

(e) The CPU 12 adds the power consumption values of all of the power supply groups to calculate the total power consumption value of the semiconductor device. The total power consumption value is represented by $$1.65 \cdot (Q1 \cdot F3 + Q2 \cdot F4) + 1.25 \cdot (Q1 \cdot F1 + Q2 \cdot F2) + 2.5 \cdot Q3 \cdot (F3 + F4).$$

The eighth step S58 calculates the delay. In the eighth step, the CPU calculates the delay time by applying a potential to each logic element based on the power supply group information of each logic element.

The layout designing method of the preferred and illustrated embodiment has the advantages described below.

(1) The CPU 12 names power supply types in accordance with their purposes (step S41a) and associates each logic element with the power supply type name (step S41b). Then, the CPU 12 defines each independent power supply as a power supply group (step S51), associates the power supply type names and the supplied voltage with each power supply group (step S52), and allocates a power supply group for each logic element. In the above method, the power supply is set before determining the logic elements in a functional block. Further, the burden on the operator for setting the power supply provided to each logic element of a semiconductor device is reduced. Additionally, a power supply group is formed for each independent power supply. In addition to separating a low potential and a high potential, a high potential may be separated into a plurality of high potentials.

(2) Each power supply input terminal of each logic element is pre-associated with its supplied power. Based on the associated relationship, the CPU 12 generates the power supply net list for connecting the power supply of each power supply group to the power supply terminals associated with the logic elements (step S54). As a result, the wiring separation of power supplies in a multiple power supply semiconductor device is performed automatically.

(3) The CPU 12 applies different potentials to the logic elements based on the power supply group information of each logic element to calculate the power consumption (step S57). Accordingly, the power consumption of the multiple power supply semiconductor device is effectively performed. That is, the difference in the power supply voltage supplied to each logic element is reflected on the power consumption calculation result.

(4) The CPU 12 applies different potentials to the logic elements based on the power supply group information of each logic element to calculate the time delay (step S57). Accordingly, the time delay of the multiple power supply semiconductor device is effectively performed. That is, the difference in the power supply voltage supplied to each logic element is reflected on the delay calculation result.

It should be apparent to those skilled in the art that the present invention may be embodied in many other specific forms without departing from the spirit or scope of the invention. Particularly, it should be understood that the present invention may be embodied in the following forms.

The first sub-step S41a defines three power supplies. However, in addition to the three power supplies, an analog power supply, a negative potential power supply, and an independently used ground may also be defined.

The generation of the power supply net list in step S54 may be deleted. In this case, the power supply separation information may be generated by allocating a power supply group to each module, each logic element, and each terminal. The processing of the layout, calculation of the power consumption, and calculation of the delay time may be performed based on the power supply separation information.

In step S52, instead of allocating the power supply groups to the logic elements, the power supply groups may be allocated to a signal line or signal terminal connected to a logic element. In this case, the information of the power supply group associated with the power that is to be supplied to the logic element is added to the information of the signal terminal. Alternatively, the information of the power supply group associated with the power that is to be supplied to the logic element may be added to the information of the signal terminal.

The allocation of a power supply group to a signal line or a signal terminal has the following advantages. Referring to FIG. 15, for example, a plurality of external terminals 72 are arranged at the peripheral portion of a semiconductor device 71. An I/O cell 73 is arranged at the inner side of each external terminal 72. Since one external terminal 72 is connected to one I/O cell 73, the I/O cell 73 is designated when the external terminal 72 is designated. Thus, power supply designing may be performed before determining the position of the I/O cells 73 by allocating the power supply groups to the external terminals. In other words, when generating a frame for determining the position of I/O terminals before determining the arrangement of the internal logic elements, power supply designing may be performed based on the names of the I/O terminals. This enables power supply designing and various calculations to be performed at an early stage of the designing process and shortens the total design time of the semiconductor device.

Further, by allocating a power supply group power to an external terminal of a module formed by a plurality of logic elements, such as a terminal connected to other modules, the power supply designing may be performed before determining the specific arrangement of the logic elements in the module.

Before and after processing the layout in step S55, the allocation of the power supply groups may be corrected manually. For example, the CPU 12 displays on the display 15 the logic elements to which the power supply groups are allocated. The designer then looks at the displayed image and manipulates the input device 16 to change the allocation of the power supply group. The CPU 12 changes the power supply net list in accordance with the changed power supply group allocation and reflects the change on the power supply separation information (the information of the power groups set at each hierarchical level) of each logic element. Alternatively, the CPU 12 may directly change the power supply separation information of each logic element based on changes in the allocation of the power supply groups. The correction of the allocation enables finer designing of a multiple power supply semiconductor device.

The steps illustrated in FIG. 2 may be performed by a plurality of computer systems. For example, a first computer system may generate logic information and a library that defines the names of power supplies, and a second computer system may generate layout data. Alternatively, the logic information generation, cell library generation, layout design, power consumption calculation, and delay calculation may be performed by different computer systems.

The present examples and embodiments are to be considered as illustrative and not restrictive, and the invention is not to be limited to the details given herein, but may be modified within the scope and equivalence of the appended claims.

What is claimed is:

1. A method for designing a semiconductor device having a plurality of logic elements provided with a plurality of power supplies, the method comprising the steps of:

giving a power supply type name to each power supply in accordance with the purpose of the power supply in each logic element;

associating each logic element with the power supply type name of the power supply that is to be provided to the logic element;

forming a power supply group for each power supply;

generating specific information of each power supply group associating the power supply type name with supplied voltage; and determining the power supply provided to each logic element by allocating the power supply group, which is associated with the supplied voltage and the power supply type name of the power supply provided to the logic element, to the logic element.

2. The method according to claim 1, wherein the logic element is designed individually or designed to be included in a module, and wherein the step for determining the power supply includes allocating an associated one of the power supply groups to one of each logic element and the module.

3. The method according to claim 2, wherein information of each logic element is collected at a first hierarchical logic level, and information of the module is collected in a second hierarchical level, which is higher than the first hierarchical level, and wherein the step for determining the power supply includes allocating the power supply group in either the first or second hierarchical logic levels.

4. The method according to claim 1, wherein each logic element includes a plurality of power supply terminals, and wherein the step for determining the power supply includes allocating the associated one of the power supply groups to each power supply terminal of each logic element.

5. The method according to claim 1, wherein a signal line is connected to each logic element, and each logic element has a signal terminal, wherein the step for determining the power supply includes allocating the associated one of the power supply groups to either the signal line or the signal terminal of each logic element.

6. The method according to claim 1, further comprising the step of:

generating a power supply net list for connecting each logic element with the associated power supply based on the determination of the provided power supply.

7. The method according to claim 1, further comprising the step of:

calculating power consumption of each logic element using the specific information of the power supply group allocated to each logic element.

8. The method according to claim 1, further comprising the step of:

calculating delay time of each logic element using the specific information of the power supply group allocated to each logic element.

9. A computer readable recording medium recording a program for designing a semiconductor device having a plurality of logic elements provided with a plurality of power supplies, the program includes the steps of:

giving a power supply type name to each power supply in accordance with the purpose of the power supply in each logic element;

associating each logic element with the power supply type name of the power supply that is to be provided to the logic element;

forming a power supply group for each power supply;

generating specific information of each power supply group associating the power supply type name with supplied voltage; and determining the power supply provided to each logic element by allocating the power supply group, which is associated with the supplied voltage and the power supply type name of the power supply provided to the logic element, to the logic element.

10. The recording medium according to claim 9, wherein the logic element is designed individually or designed to be included in a module, and wherein the step for determining the power supply includes allocating an associated one of the power supply groups to one of each logic element and the module.

11. The recording medium according to claim 10, wherein information of each logic element is collected at a first hierarchical logic level, and information of the module is collected in a second hierarchical level, which is higher than the first hierarchical level, and wherein the step for determining the power supply includes allocating the power supply group in either the first or second hierarchical logic levels.

12. The recording medium according to claim 9, wherein each logic element includes a plurality of power supply terminals, and wherein the step for determining the power supply includes allocating the associated one of the power supply groups to each power supply terminal of each logic element.

13. The recording medium according to claim 9, wherein a signal line is connected to each logic element, and each logic element has a signal terminal, wherein the step for determining the power supply includes allocating the associated one of the power supply groups to either the signal line or the signal terminal of each logic element.

14. The recording medium according to claim 9, further comprising the step of:

generating a power supply net list for connecting each logic element with the associated power supply based on the determination of the provided power supply.

15. The recording medium according to claim 9, further comprising the step of:

calculating power consumption of each logic element using the specific information of the power supply group allocated to each logic element.

16. The recording medium according to claim 9, further comprising the step of:

calculating delay time of each logic element using the specific information of the power supply group allocated to each logic element.

* * * * *